United States Patent [19]
Farkas et al.

[11] Patent Number: 6,001,730
[45] Date of Patent: *Dec. 14, 1999

[54] CHEMICAL MECHANICAL POLISHING (CMP) SLURRY FOR POLISHING COPPER INTERCONNECTS WHICH USE TANTALUM-BASED BARRIER LAYERS

[75] Inventors: Janos Farkas, Austin, Tex.; Rajeev Bajaj, Fremont, Calif.; Melissa Freeman, Round Rock, Tex.; David K. Watts; Sanjit Das, both of Austin, Tex.

[73] Assignee: Motorola, Inc., Schaumburg, Ill.

[*] Notice: This patent is subject to a terminal disclaimer.

[21] Appl. No.: 08/954,191

[22] Filed: Oct. 20, 1997

[51] Int. Cl.$^6$ ............................................. H01L 1/00
[52] U.S. Cl. ........................... 438/627; 438/629; 438/633; 438/648; 438/656; 438/643; 438/645; 438/653; 438/669; 438/672; 438/685; 438/687; 438/692; 438/693; 106/3; 106/11; 51/309
[58] Field of Search ...................... 438/627, 629, 438/633, 643, 645, 648, 653, 656, 669, 672, 685, 687, 692, 693; 106/3, 11; 51/309

[56] References Cited

U.S. PATENT DOCUMENTS

| 4,954,142 | 9/1990 | Carr et al. ................... 51/309 |
| 4,959,113 | 9/1990 | Roberts ..................... 156/636 |
| 5,225,034 | 7/1993 | Yu et al. ..................... 156/636 |
| 5,676,587 | 10/1997 | Landers et al. ............. 451/57 |
| 5,770,103 | 7/1997 | Wang et al. .............. 252/79.1 |
| 5,897,375 | 10/1997 | Watts et al. ............... 438/693 |

OTHER PUBLICATIONS

J.M.Steigerwald et al., "Mat. Res. Soc. Symp. Proc.," vol. 337, 1994, Method of Chemica Mechanical Polishing Predominantly Copper Containing Metal Layers in Semiconductor Processing, pp. 133–138.

*Primary Examiner*—John F. Niebling
*Assistant Examiner*—David A. Zarneke
*Attorney, Agent, or Firm*—Keith E. Witek

[57] ABSTRACT

A method for forming a copper interconnect on an integrated circuit (IC) begins by forming a dielectric layer (20) having an opening. A tantalum-based barrier layer (21), such as TaN or TaSiN, is formed within the opening in the layer (20). A copper layer (22) is formed over the barrier layer (21). A first CMP process is used to polish the copper (22) to expose portions of the barrier (21). A second CMP process which is different from the first CMP process is then used to polish exposed portions of the layer (21) faster than the dielectric layer (20) or the copper layer (22). After this two-step CMP process, a copper interconnect having a tantalum-based barrier is formed across the integrated circuit substrate (12).

32 Claims, 3 Drawing Sheets

CHEMICAL MECHANICAL POLISHING (CMP) SLURRY FOR POLISHING COPPER INTERCONNECTS WHICH USE TANTALUM-BASED BARRIER LAYERS

FIELD OF THE INVENTION

The present invention relates generally to semiconductor manufacturing, and more particularly to, a two-step CMP process for copper interconnects which utilize Ta-based alloys as barrier layers in integrated circuits (ICs).

BACKGROUND OF THE INVENTION

The integrated circuit (IC) industry is currently researching and developing new metallic interconnect materials and structures which can be used within integrated circuits (ICs). A promising metallic material which will be used in the future for integrated circuit (IC) interconnects is copper (Cu). Copper is desired in the integrated circuit industry since copper has improved electromigration resistance over aluminum and other metallic materials which are currently being used in the integrated circuit industry. In addition, copper has a lower resistivity than other commonly used metallic materials, whereby the performance of integrated circuit devices can be greatly improved through the use of copper interconnects. Also, copper interconnects allow an integrated circuit to use higher critical current.

However, there is currently no known technology which can effectively plasma etch or wet etch copper materials so that functional copper interconnects are adequately formed over the surface of an integrated circuit. In order to overcome this limitation, copper chemical mechanical polishing (CMP) has been suggested as the most promising alternative which can render proper formation of copper interconnects on an integrated circuit. Therefore, the industry is currently searching for an optimal chemical mechanical polishing (CMP) slurry which can be used to form copper interconnects on an integrated circuit (IC).

In addition, copper readily diffuses into conventional silicon-based materials such as polysilicon, single-crystalline silicon, silicon dioxide, low-k inorganic and organic materials, and the like. Once these silicon-based materials have been contaminated with Cu atoms, the dielectric contstant of the silicon-based dielectrics is adversely affected. In addition, once semiconductive silicon-based materials are Cu doped, transistors made within or in close proximity to the Cu doped silicon-based regions either cease to function properly or are significantly degraded in electrical performance. Therefore, in addition to the challenges of finding an adequate copper polishing process, an adequate copper barrier material is also needed. In addition, this barrier material must be integrated with the CMP process to obtain optimal electrical performance, optimal planarization, improved throughput, etc., in order to render copper technology in IC designs feasible.

It is known to use one of $Fe(NO_3)_3$, $HNO_3$, $HN_4OH$, or $KMnO_4$ to perform polishing of copper. These chemical compounds have been extensively researched by CMP engineers in an attempt to discover an optimal copper CMP process. However, the use of these known chemicals has not yet produced optimal copper polishing results. For example, various experimentation performed using the known chemistries described above have resulted in one or more of: (1) poor removal rate whereby CMP throughput is inadequate; (2) excessive pitting and/or corrosion of the copper material whereby device performance and device yield is reduced; (3) layer planarity problems; (4) poor IC electrical performance; or (5) poor selectivity to copper over adjacent oxide materials ("oxide" refers to "silicon dioxide" and the two may be used interchangeably herein.). In addition, the current CMP research using copper interconnects with tantalum-based barriers has shown that most widely-used copper CMP processes have high selectivity to tantalum-based alloys. With the high copper to tantalum selectivity of current copper polishing, a wafer must either be: (1) significantly overpolished to ensure adequate tantalum-based barrier material removal whereby copper regions are significantly dished (i.e., poor planarity results); or (2) polished less aggressively whereby some tantalum-based barrier material may remain on the device causing short circuits or excessive leakage paths in the IC.

Therefore, a need exist in the industry for an improved CMP slurry which may be used to manufacture copper interconnects while reducing or eliminating one or more of the above common copper CMP problems when copper is used in conjunction with a tantalum-based material. This improved slurry should have one or more of: good removal rate whereby CMP throughput is improved; reduced or eliminated pitting and corrosion of the copper material whereby device performance and yield is improved; improved planarity of the copper layer; improved electrical performance of integrated circuits, adequate selectivity of copper to oxide; and improved removal of a tantalum-based barrier without adversely affecting the overall copper structure.

Figure 1:
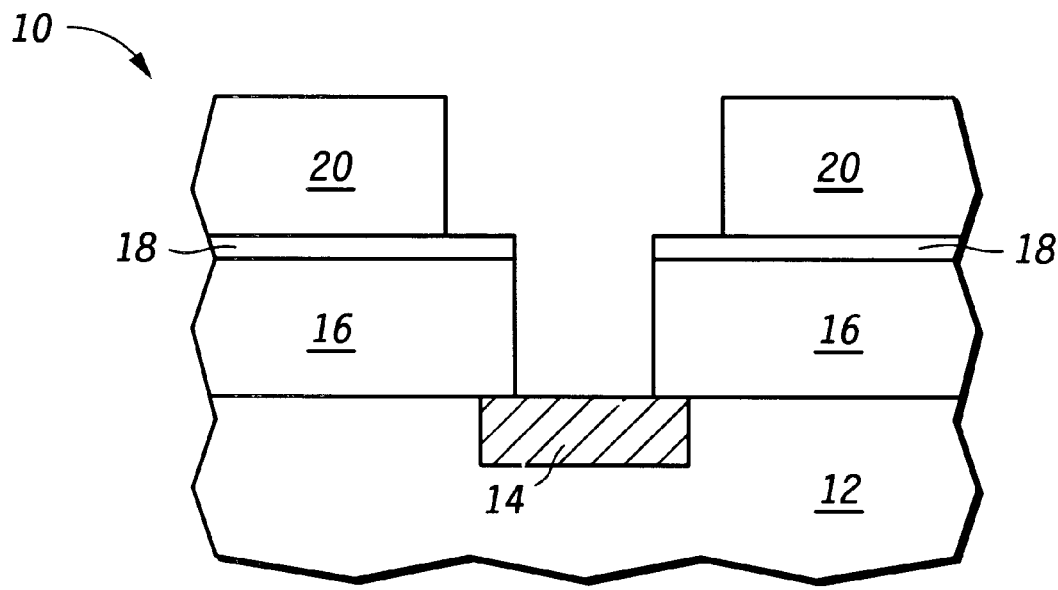
FIGS. 1–6 illustrate, in cross-sectional diagrams, a method for forming a chemical mechanical polish (CMP) copper interconnect which uses a tantalum-based barrier layer whereby polishing occurs in accordance with the present invention.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a two-step chemical mechanical polishing (CMP) process for forming a copper interconnect on an integrated circuit (IC) wherein the copper interconnect uses a tantalum-based barrier layer. This two step CMP process uses a novel slurry taught herein which improves copper interconnect technology. The copper interconnect polish step taught herein uses a novel copper-polishing slurry and a hard polishing pad to polish a bulk of the copper material to expose top portions of the barrier layer. The copper polish process stops reasonably well on the tantalum-based barrier layer whereby overpolishing of the copper (Cu or copper alloy) is avoided. After removing a bulk of the copper material, a second slurry and a softer polishing pad are used to polish away upper portions of the tantalum-based barrier layer reasonably selective to the oxide and the copper. This second polishing step in the two-set polishing process may take the place of an oxide touch-up polish process which is typically used after conventional copper polishing.

It has been experimentally shown that the use of this two step copper interconnect CMP process, whereby a first polish step polishes the copper and a second polish step polishes the tantalum-based barrier, results in several improvement over the prior art.

First, advantages with the first polish step include an improved removal rate of copper. This improved removal allows the throughput through a CMP processing tool to be improved whereby manufacturing costs may be decreased. Removal rates of greater than 5000 angstroms per minute have been consistently observed, and fine-tuned processes as taught herein achieve removal rates that approach 8000 angstroms per minute or more. In addition, experimental results performed on the first part of the two-part polish step have shown reduced pitting and corrosion of the copper material whereby the speed of the integrated circuit is improved and the yield of the integrated circuit is also improved over prior art copper CMP processes. In addition, it has been found that good planarity can be achieved when using the first CMP step taught herein. Good planarity results in enhanced cross-sectional area of the copper interconnects whereby electrical performance is improved by reducing interconnect resistance. In addition, the polishing selectivity of both: (1) copper to silicon dioxide; and (2) copper to tantalum-based barrier materials, is high when using this first slurry. Therefore, the first slurry allows for effective polish stopping when performing dual inlaid or single inlaid copper processing. Further, the copper CMP slurry used in the first step of the two-step process taught herein is much more environmentally sound than other slurries which are used in the integrated circuit (IC) industry.

With respect to the second step of the polishing process, the second polishing process is used to remove the tantalum-based barrier selective to silicon dioxide regions and selective to exposed copper or copper alloy regions. Therefore, the use of this two step process will reduce the need for overpolishing of copper whereby planarity is further improved while enabling the highly advantageous tantalum-based barriers to be used in a copper interconnect. The second step of the two-step polish process taught herein ensures that no tantalum-based material is left on the wafer between copper interconnect lines whereby yield is improved over the prior art processing techniques. Another advantage is that the final planarity of the copper interconnects can be adjusted by the process to allow an easier integration of the dual inlaid structure into integrated circuits.

The invention can be further understood with reference to FIGS. 1–6.

FIGS. 1–6 illustrate a method for forming a copper interconnect for an integrated circuit (IC) wherein a tantalum-based barrier layer may also be used within the copper interconnect. FIG. 1 illustrates a semiconductor structure 10 which has a substrate 12. In FIG. 1, a substrate 12 has a base/bottom region which is typically a single crystalline silicon wafer. However, other semiconductor substrates can be used such as germanium, gallium arsenide, germanium silicon, silicon-on-insulator (SOI) substrates, silicon carbide substrates, epitaxial layers, polysilicon substrate, and the like.

Although not specifically illustrated in FIG. 1, conventional integrated circuit processing is used to form field isolation and active electrical devices (e.g., capacitors, MOSFETs, bipolar devices, diodes, logic gates, memory devices, etc.) over the surface of the starting substrate material. These layers are inherently and collectively illustrated as the bottom/base layer 12 in FIG. 1. These active devices formed over the substrate may be interconnected by semiconductive layers such as polysilicon, amorphous silicon, or salicided regions. In the alternative, these active circuits may also be interconnected by metallic interconnects or some combination of semiconductive interconnects and metallic interconnects. FIG. 1 illustrates a layer 14 which is representative of at least one of these semiconductive or metallic interconnect structures. If the layer 14 is chosen to be a metal interconnect, a material such as tungsten, aluminum, and aluminum alloy, copper, gold, silver, other refractory metals, conductive oxides, composites thereof, or the like is typically chosen for use in layer 14.

FIG. 1 illustrates that a dielectric layer 16 is formed over a top of the interconnect structure 14. In one form, the layer 16 of FIG. 1 is a furnace tetraethylorthosilicate (TEOS) layer and/or an ozone TEOS layer. In other forms, the layer 16 can be a low-k dielectric, borophoshosilicate glass (BPSG), fluorinated TEOS (FTEOS), polymer materials, plasma enhanced chemical vapor deposited (PECVD) TEOS, composites thereof, and the like. A typical thickness for the layer 16 is somewhere between a range of roughly 2000 Å to 8000 Å and the dielectric layers are typically formed by some form of chemical vapor deposition (CVD) or by a spin-on-glass (SOG) process.

An etch stop layer 18 is then formed over a top of the layer 16. Layer 18 is typically formed from a plasma enhanced nitride (PEN), a silicon oxynitride (SiON) material, composites thereof, like layers which have different etch rates than oxide when exposed to oxide etch species. A typical thickness for the layer 18 is between roughly 100 Å and 300 Å. It is important to note that timed etch processing may by used whereby no etch stop is needed. Therefore, the etch stop is optional in the process taught herein.

After formation of the etch stop layer 18, a dielectric layer 20 is then formed over a top of the etch stop layer 18. The material composition of the layer 20 is similar to the layer 16 which was previously discussed. In addition, the thickness of the layer 20 is comparable to the thickness of layer 16 as previously discussed. Known photolithographic processing and convention etch technology is then utilized to form a via opening through the layer 16 and a trench interconnect opening through the layer 20. These openings through the layers 16 and 20 can be formed in a via first manner or a trench first manner as is known in the dual inlaid art. Furthermore, although dual inlaid processing is shown in FIGS. 1–6, the two-step polishing process taught herein may be used to form single inlaid structures or copper plug regions in addition to dual inlaid structures.

Figure 2:
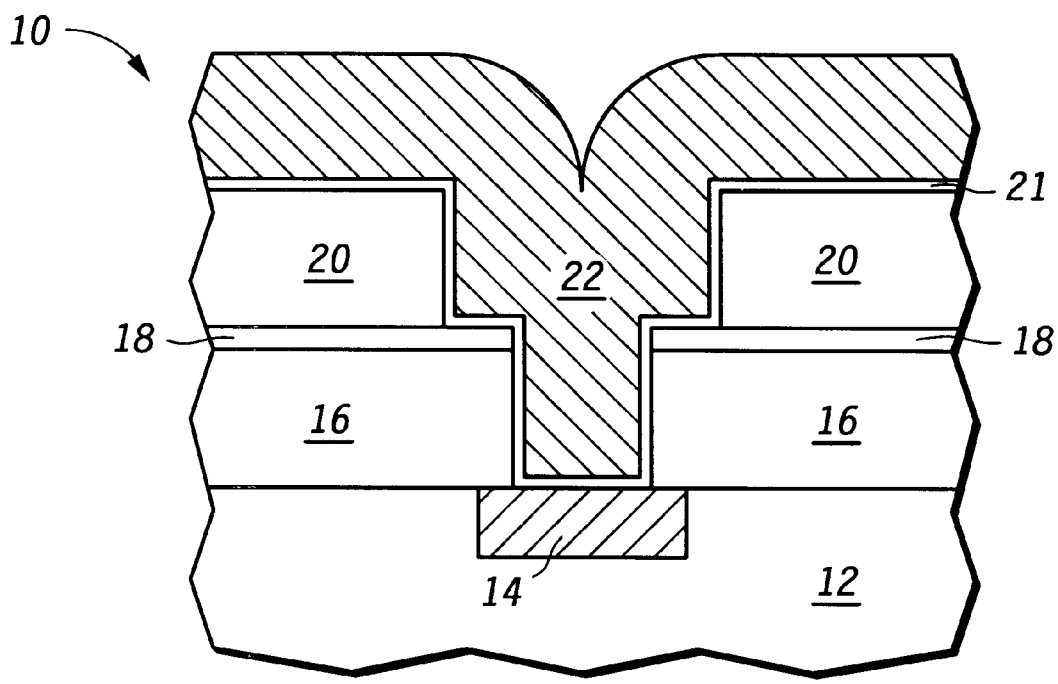

FIG. 2 illustrates that the tantalum-based barrier layer 21 is formed within the trench/interconnect opening in layer 20, within the via opening in layer 16, and over a top surface of the layer 20. The tantalum-based barrier layer is one or more of tantalum, tantalum nitride (TaN), tantalum silicon nitride (TaSiN), composites thereof or the like in a preferred form. A typical thickness of the barrier layer 21 in FIG. 2 is between 100 Å and 1000 Å with roughly 300–500 Å being optimal for all of resistance, containment of copper atoms, and proper copper filling of via openings.

A conductive copper layer 22 is then deposited over a top surface of the barrier layer 21, within the via opening in layer 16, and within the interconnect opening of layer. First, a chemical vapor deposition (CVD) process is then utilized to form a seed layer of copper over the barrier layer 21 as a lower portion of the layer 22. This seed layer of copper is typically on the order of 1000–3000 Å in thickness. This seed copper material is either a pure copper layer (i.e., a copper layer not intentionally doped with another atom or set of atoms) or a copper alloy (which is intentionally doped with another atom other than Cu). In addition, this CVD copper layer may also chemically interact with the previously deposited barrier layer 21 to form at least an interface/bottom alloy material comprising both tantalum and copper. The CVD copper layer may be replaced with an ionized metal plasma (IMP) layer of copper or an IMP layer of a copper alloy. Also, collimated physical vapor deposition or electroless copper processing may be used for form the seed layer. Typically, the copper material which is deposited in FIG. 1 has a copper concentration of greater than 80%. A thin seed layer other than copper may be used in some embodiments.

After formation of the IMP and/or CVD copper layer, an electroplating process is used to form additional copper material on top of the CVD or IMP copper seed layer to form the entire thickness of layer 22. Typically, copper electroplating is performed until an overall thickness of the layer 22 of roughly 7,000–15,000 Å is achieved. In the alternative copper CVD or copper PVD may be used to complete the thickness of the copper layer in FIG. 2. The electroplated copper may either be pure copper or a copper composite material as discussed hereinabove.

Figure 3:
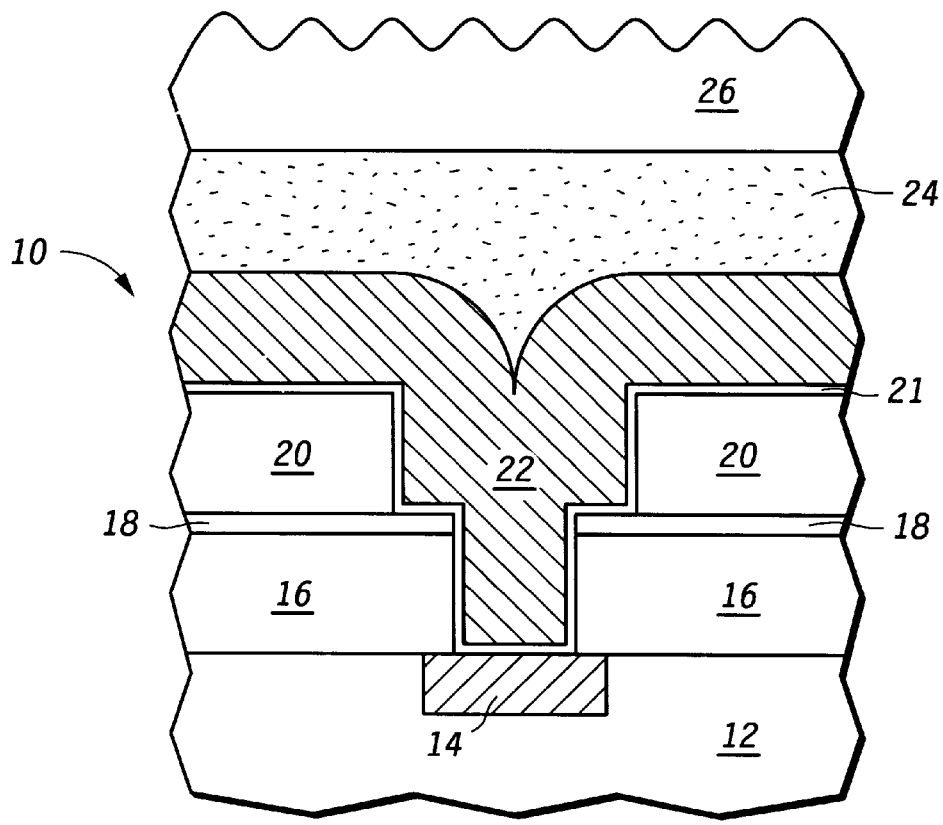

FIG. 3 illustrates that the structure 10 of FIG. 1 is placed into a chemical mechanical processing (CMP) tool. The CMP tool of FIG. 3 preferably has two platens wherein one platen is a hard platen (i.e., a harder polishing pad) and the other polishing platen is a soft polishing platen (i.e., a softer polishing pad than the hard polishing pad). In another form, two different polishing tools may be used (one with a harder pad and another with a softer pad) or the same polishing tool may be used whereby the tool has platens which are easily interchanged to enable quick changes in pad hardness with little down time.

The copper layer 22 of FIG. 1 is placed into contact with a chemical mechanical polishing (CMP) slurry 24 as illustrated in FIG. 3. The harder chemical mechanical polishing pad 26 in the CMP tool is placed in contact with the slurry 24 and is mechanically rotated and applied with pressure in order to result in effective chemical/mechanical removal of upper portions of the layer 22 in FIG. 3.

In order to remove copper material from layer 22, the slurry 24 forms a thin (e.g., tens of angstroms) copper oxide or oxidized layer on a top surface of the layer 22. This thin oxidized copper layer is formed due to the exposure of the layer 22 to the slurry 24 in FIG. 2. In essence, the slurry 24 contains an oxidizing species which oxidizes a thin top portion of the layer 22 to form the thin copper oxide layer on a top of the layer 22. Other chemical species within the slurry 24 will chemically attack this oxidized layer to dissolve the copper oxide layer into the slurry 24. In addition, various particles or abrasive slurry materials within the slurry 24 along with the mechanical movement of the polishing pad 26 results in mechanical abrasion of the oxidized layer to further effectuate removal of the layer 22 over time. Through progressive oxidation and removal of oxidized copper, top surfaces of the layer 22 are incrementally removed to enable effective copper chemical mechanical polishing (CMP).

The slurry 24, illustrated in FIG. 3, contains an oxidizing agent, a carboxylate salt (e.g., a citrate salt), an abrasive slurry/agent, a solvent, and an optional triazole or triazole derivative. Specifically, the oxidizing agent which can be utilized within the slurry is hydrogen peroxide (H202). Carboxylate salts which have been shown to be effective for removal of copper includes one of many citrate salts such as one or more of ammonium citrate or potassium citrate. A typical abrasive which has been experimentally shown to result in good copper removal and planarization is an alumina abrasive, but a silica abrasive in lieu of the alumina abrasive or in addition with the alumina abrasive may be advantageous. In addition, an optional triazole derivative or triazole solution may be added to the slurry. It was experimentally found, for example, that the addition of 1,2,4-triazole to the copper CMP slurry has been shown to improve copper planarization by reducing the amount of copper recessing into oxide trench openings. Typical solvents used in the slurry 24 of FIG. 2 is one or more of deionized water ($H_2O$) or an alcohol.

In general, the oxidizing agent ($H_2O_2$) of the slurry 24 may be within any range of roughly 0.2 weight percent (wt %) to 5.0 weight percent (wt %). The carboxylate salt or citrate salt can be within a range of roughly 0.2 weight percent to roughly 20 weight percent. The abrasive slurry/agent (alumna abrasive) is roughly 1.0 weight percent to 12.0 weight percent of the slurry 24. In addition, an optional triazole or triazole derivative can be provided within the slurry 24 to be roughly 0.05 weight percent to 2.0 weight percent of the slurry 24. A remaining balance of the slurry 24 is typically deionized water and/or an alcohol solution.

In a preferred form, it has been experimentally shown that adequate copper (Cu) polishing has been achieved using a hydrogen peroxide range between 1.0 weight and 1.5 weight percent, a citrate salt concentration within the range of 0.8 weight percent and 1.3 weight percent, an alumna abrasive concentration within the range of 2.0 weight percent and 4.0 weight percent, a triazole concentration between roughly 0.1 weight percent and 0.2 weight percent, and a remaining balance solvent. A preferred solution within this range which has been utilized is 1.2 weight percent hydrogen peroxide, 1.1 weight percent ammonium citrate, 3.0 weight percent alumna slurry, 0.12 weight percent, 1,2,4-triazole, and a remaining balance deionized water ($H_2O$).

In this preferred form, the copper polishes at or above roughly a 4000 angstroms/min rate or more, TaSiN barrier materials polish at a rate of 350 angstroms/min or less, and silicon dioxide polishes at a rate of 250 angstroms/min or less. Slower polishing times are possible, but will affect throughput. Therefore, the Cu polishing process of FIG. 3 will effectively stop on the tantalum-based barrier layer 21 as shown in FIG. 4.

Figure 4:
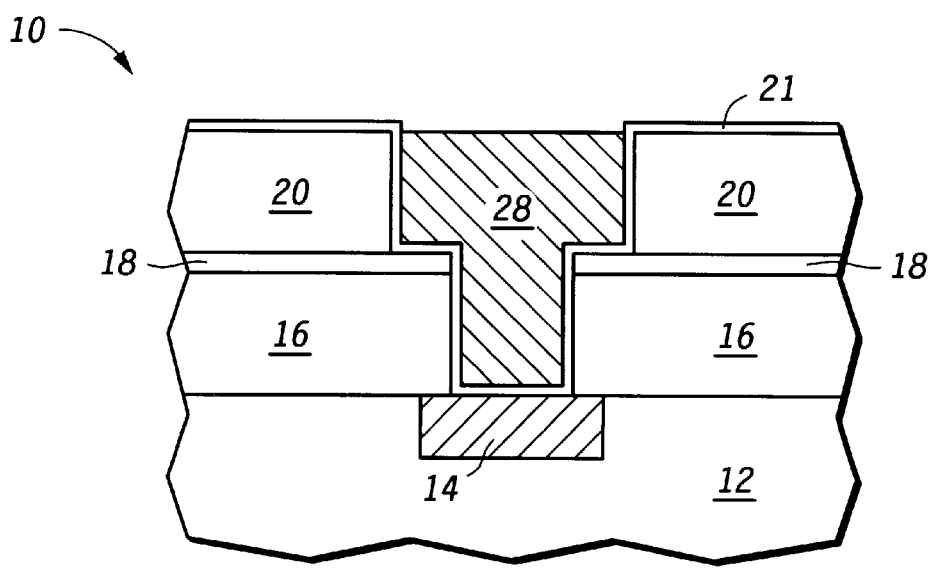

FIG. 4 illustrates that the first step of the two-step chemical mechanical polishing (CMP) process is complete. The first step used the slurry 24 and harder platen/pad 26 to polish copper material until a copper interconnect 28 is formed as illustrated in FIG. 4. The copper interconnect is formed when all copper material is removed from all areas outside the trench opening in layer 20 and the via opening in layer 16. In a preferred form, the interconnect 28 would be formed co-planar with the top surface of the layer 21. However, some recessing/dishing of the copper layer 22 can occur in most CMP systems resulting in a slight recess of the copper portion of the interconnect 28 as shown in FIG. 4. It should be noted that this recess/dishing can be compensated for by the subsequent removal of the tantalum-based barrier by the second CMP polishing step. In other words, the second polish step may reduce the effects of dishing/recess. It is important to note that the presence of the triazole or triazole derivative in the CMP slurry has been experimentally shown to also reduce this adverse recessing of the copper interconnect 28. In addition, the presence of the TaSiN (which is subsequently removed and acts as a copper polish stop) ensures that the overall recess of the copper below a top surface of the underlying dielectric is lessened in an advantageous manner. However, total elimination of the recessing of the layer 28 may not be possible in all applications. In these cases, subsequent removal of the barrier layer 21 by the second step of the two-step CMP process will result in the co-planarization of the interconnect-oxide surfaces whereby an oxide touch-up step will not likely be needed in many applications of the two-step process taught herein.

Figure 5:
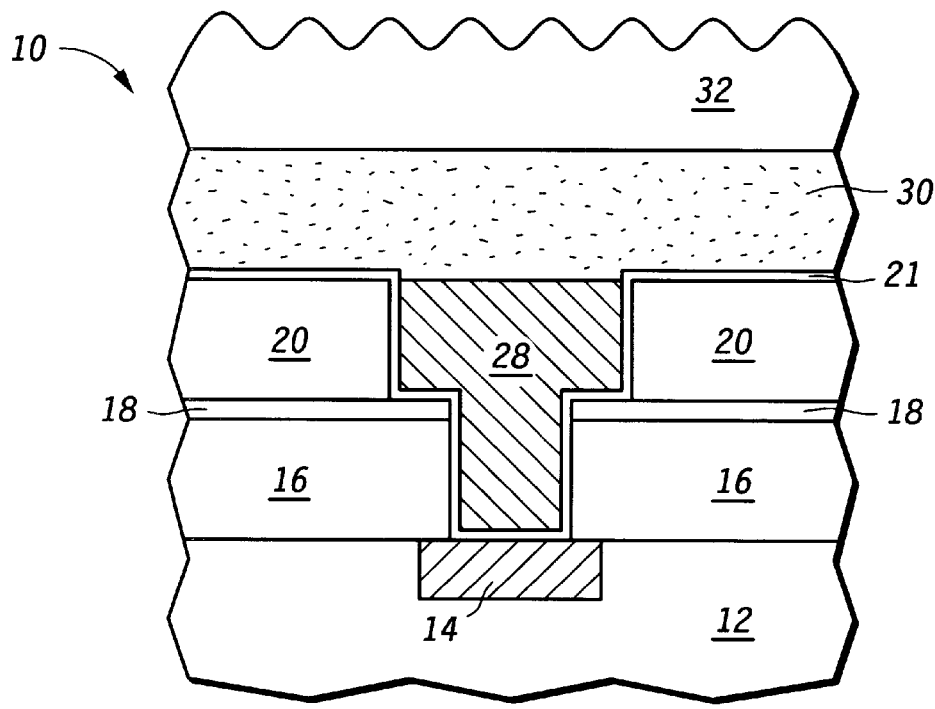
Figure 6:
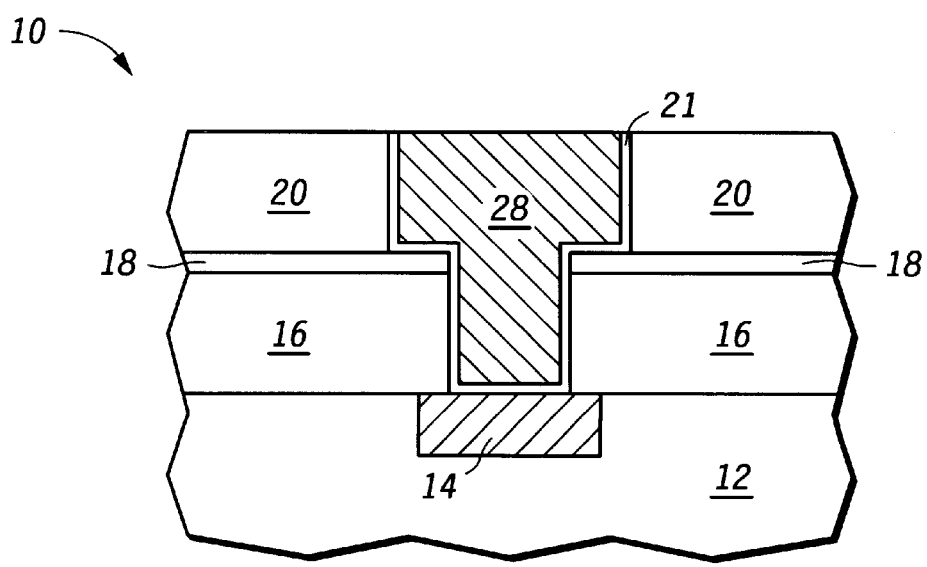

It is important to note that the copper recessing problem illustrated in FIG. 4 can be remedied by the second step of the two-step CMP process or may be remedied by yet another (a third) CMP step performed after the second CMP step of FIGS. 5–6. A subsequent oxide polish performed after FIG. 6 in addition to the copper/tantalum-based two-step polish illustrated in FIGS. 2–5 may be used. In order to perform the oxide polish (e.g., oxide touch-up), a third slurry and a third polishing pad are applied over the top of semiconductor structure after FIG. 6 in order to perform a third CMP operation. This oxide polish pad will preferably be the harder polish pad used to perform the first step of the second polish process or may be a similar, but different, polishing pad. The oxide slurry 30 is typically a silica abrasive which contains KOH and deionized water. This oxide slurry in conjunction with the harder polishing pad will enable effective removal of a thin top portion of layer 20 whereby the layer 20 is once again made co-planar with the top surface of the copper interconnect 28 if the polish of FIGS. 5–6 has not made the various layers 20–22 co-planar already.

In FIG. 5, a second slurry 30 and a second polishing pad 32 are applied to the device 10. The second slurry is designed to remove the tantalum-based barrier layer selective to oxide and copper. The second CMP step of FIGS. 5–6 uses a slurry containing 1.0 wt % to 12.0 wt % of silica abrasive, 0.01 wt % to 2.0 wt % of an amine compound, with a remaining balance solvent (e.g., deionized water and/or an alcohol). Typically a slurry pH of 9.0 to 11.0 is preferred. Experimentation has shown that a preferred amine compound is an ethylendiamine additive. In one embodiment, a specific second CMP slurry, used in conjunction with a specific polishing pad (e.g., IC1400), was used wherein the slurry consisted of 7.5 wt % silica abrasive, 0.05 wt % ethylendiamine, and a remaining balance deionized water. In this process, the polish rate of TaSiN was roughly 550 angstroms/min, the polish rate of copper was roughly 330 angstroms/min, and the polish rate of silicon oxide was roughly 340 angstroms/min. Therefore, complete polishing of the copper interconnect and barrier can be accomplished in less than two minutes using the process taught herein.

In another experiment, a Polytex "softer" polishing pad was used with a slurry comprising 1% ethylendiamine, Cabot Semisperse SCE abrasive, with a final pH of 10. for this experiment, a TaSiN polishing rate of roughly 470 angstroms/min was achieved, the polish rate of copper was roughly 330 angstroms/min, and the polish rate of silicon oxide was roughly 340 angstroms/min.

When using this two-step process taught herein, planarity was found to be within a deviation of roughly 200–1000 angstroms at a maximum. This is roughly a 1.5× to 4.0× improvement over all other known copper polishing techniques used on Cu/Ta-based dual inlaid stacks. In addition, sufficiently low copper removal rate (<500 angstroms/min for copper) was achieved in the second CMP step whereby CMP throughput was improved, reduced or eliminated pitting and corrosion of the copper material was shown whereby device performance and yield was improved, improved planarity of the copper layer was found over prior art techniques, improved electrical performance of integrated circuits was found, adequate selectivity of copper to oxide and copper to Ta-based barrier was found in the first CMP step, adequate selectivity of tantalum alloy to oxide and tantalum alloy to copper was found in the second CMP step, and improved removal of a tantalum-based barrier was achieved without adversely affecting the overall copper inlaid structure.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, the thicknesses discussed herein will most likely shrink over time as lithographic feature sizes shrink and technological advancement progresses. Other deposition methods such as low pressure CVD (LPCVD), plasma enhanced CVD (PECVD), physical vapor deposition (PVD), electroless plating, sputtering, and the like may be used to form various layers herein. Other oxidation agents other than $H_2O_2$ may be used wherein the oxidation agent taught herein can be any chemical that oxidized copper. A triazole derivative, as discussed herein, is any triazole molecule that has any other atoms bonded to the triazole molecule. Therefore, it is intended that this invention encompass all of the variations and modifications as fall within the scope of the appended claims.

What is claimed is:

1. A method for forming a copper interconnect on an integrated circuit, the method comprising the steps of:
   providing a dielectric layer having a top surface;
   forming an opening in the dielectric layer;
   forming a tantalum-based barrier layer within the opening;
   forming a copper layer over the tantalum-based barrier layer;
   polishing the copper layer until a portion of the tantalum-based barrier layer is exposed, the polishing of the copper layer using a first CMP slurry; and
   polishing the tantalum-based barrier layer to expose a top surface of the dielectric layer, the polishing of the tantalum-based barrier layer using a second CMP slurry different from the first CMP slurry, the second CMP slurry having a non-neutral pH.

2. The method of claim 1 wherein the first CMP slurry is a slurry comprising:
   on an order of 0.2 wt % to 5 wt % of an oxidizing agent;
   on an order of 0.2 wt % to 20 wt % of a carboxylate salt; and
   on an order of 1.0 wt % to 12 wt % abrasive slurry.

3. The method of claim 2 wherein the carboxylate salt is a citrate salt.

4. The method of claim 3 wherein citrate salt is ammonium citrate.

5. The method of claim 3 wherein citrate salt is potassium citrate.

6. The method of claim 1 wherein the first CMP slurry also contains 1,2,4-triazole or a triazole derivative.

7. The method of claim 1 wherein the first CMP slurry comprises:
   on an order of 1.0 wt % to 1.5 wt % of hydrogen peroxide;
   on an order of 0.8 wt % to 1.3 wt % of a citrate salt; and
   on an order of 2.0 wt % to 4.0 wt % abrasive slurry.

8. The method of claim 7 wherein citrate salt is ammonium citrate.

9. The method of claim 1 wherein the second CMP slurry comprises:

on an order of 1.0 wt % to 12.0 wt % of an abrasive slurry; and on an order of 0.01 wt % to 2.0 wt % of an amine compound.

10. The method of claim 9 wherein abrasive slurry is a silica abrasive.

11. The method of claim 9 wherein the second CMP slurry has a pH between 9 and 11.

12. The method of claim 1 wherein the first CMP slurry polishes the copper layer at a rate of greater than 5000 angstroms per minute and polishes the tantalum-based barrier layer at a rate of less than 350 angstroms per minute, and wherein the second CMP slurry polishes the copper layer at a rate of less than 400 angstroms per minute and polishes the tantalum-based barrier layer at a rate of greater than 450 angstroms per minute.

13. The method of claim 1 wherein the first CMP slurry is used in conjunction with a first polishing pad and the second CMP slurry is used in conjunction with a second polishing pad wherein the second polishing pad is softer that the first polishing pad.

14. The method of claim 1 wherein the step of forming the dielectric layer comprises:

forming the dielectric layer from several dielectric layers and at least one etch stop layer whereby the opening in the dielectric layer is formed as a dual inlaid opening.

15. The method of claim 1 wherein the tantalum-based barrier layer comprises one of either tantalum nitride or tantalum silicon nitride.

16. A method of polishing a copper layer having a tantalum-based barrier layer, the method comprising the steps of:

providing a dielectric layer;

forming an opening in the dielectric layer;

forming the tantalum-based barrier layer within the opening;

forming the copper layer over the tantalum-based barrier layer;

polishing the copper layer using a first CMP process comprising a carboxylate salt; and polishing the tantalum-based barrier layer using a second CMP process comprising an amine compound.

17. The method of claim 16 wherein the first CMP process uses a first CMP pad and the second CMP process uses a second CMP pad wherein the first CMP pad is harder than the second CMP pad.

18. The method of claim 16 wherein the first CMP process uses a first CMP slurry and the second CMP process uses a second CMP slurry wherein the first CMP slurry is different from the second CMP slurry.

19. The method of claim 18 wherein the first CMP slurry comprises:

on an order of 0.2 wt % to 5 wt % of an oxidizing agent;

on an order of 0.2 wt % to 20 wt % of a carboxylate salt; and on an order of 1.0 wt % to 12 wt % abrasive slurry; and the second CMP slurry comprises:

on an order of 1.0 wt % to 12.0 wt % of an abrasive slurry; and on an order of 0.01 wt % to 2.0 wt % of an amine compound.

20. The method of claim 18 wherein the first CMP slurry comprises an alumina abrasive slurry and the second CMP slurry comprises a silica abrasive slurry.

21. The method of claim 18 wherein the first CMP slurry comprises an alumina abrasive slurry and the second CMP slurry comprises a silica abrasive slurry.

22. The method of claim 18 wherein the first CMP slurry comprises an oxidizing agent and the second CMP slurry does not contain an oxidizing agent.

23. The method of claim 18 wherein the first CMP slurry polishes the copper layer at a rate of greater than 5000 angstroms per minute and polishes the tantalum-based barrier layer at a rate of less than 350 angstroms per minute, and wherein the second CMP slurry polishes the copper layer at a rate of less than 400 angstroms per minute and polishes the tantalum-based barrier layer at a rate of greater than 450 angstroms per minute.

24. The method of claim 18 wherein the second CMP slurry comprises ethylendiamine.

25. The method of claim 16 wherein the tantalum-based barrier layer comprises one of either tantalum nitride or tantalum silicon nitride.

26. A method for forming a copper layer having a tantalum-based barrier layer, the method comprising the steps of:

forming a first dielectric layer;

forming a second dielectric layer over the first dielectric layer, the second dielectric layer having a top surface;

etching an interconnect trench in the second dielectric layer;

etching a via opening in the first dielectric layer;

depositing the tantalum-based barrier layer within the interconnect trench and the via opening;

depositing the copper layer on top of the tantalum-based barrier layer;

polishing, using a first CMP process, the copper layer to expose a portion of the tantalum-based barrier layer, the first CMP process polishing the copper layer faster than the tantalum-based barrier layer; and polishing, using a second CMP process different from the first CMP process, the tantalum-based barrier layer to expose the top surface of the second dielectric layer, the second CMP process polishing the tantalum-based barrier layer faster than the copper layer and polishing the tantalum-based barrier layer faster than the second dielectric layer wherein the first CMP slurry is used in conjunction with a first polishing pad and the second CMP slurry is used in conjunction with a second polishing pad wherein the second polishing pad is softer that the first polishing pad.

27. The method of claim 26 wherein the first CMP process uses a slurry comprising:

on an order of 0.2 wt % to 5 wt % of hydrogen peroxide;

on an order of 0.2 wt % to 20 wt % of a ammonium citrate; and on an order of 1.0 wt % to 12 wt % alumina slurry; and the second CMP process uses a slurry comprising:

on an order of 1.0 wt % to 12.0 wt % of a silica slurry; and on an order of 0.01 wt % to 2.0 wt % of ethylendiamine.

28. The method of claim 27 wherein the second CMP process uses a slurry that has a non-neutral basic pH.

29. The method of claim 28 wherein the second CMP process uses a slurry that has a non-neutral basic pH within a range of 9.0 and 11.0.

30. A method for polishing a copper interconnect, the method comprising the steps of:

forming a dielectric layer;

etching an opening in the dielectric layer;

depositing a barrier layer within the opening;

forming a copper-containing conductive material over the barrier layer;

polishing the copper-containing layer using a first chemical mechanical polihsing (CMP) process that uses a first CMP pad on a CMP processing tool;

polishing the barrier layer using a second chemical mechanical polishing (CMP) process that uses a second CMP pad on the CMP processing tool; and polishing a top surface of the dielectric layer using a third chemical mechanical polihsing (CMP) process that uses a third CMP pad on the CMP processing tool.

31. The method of claim 30 wherein the first CMP process uses a slurry comprising:

on an order of 0.2 wt % to 5 wt % of hydrogen peroxide;

on an order of 0.2 wt % to 20 wt % of a ammonium citrate; and on an order of 1.0 wt % to 12 wt % alumina slurry; and the second CMP process uses a slurry comprising:

on an order of 1.0 wt % to 12.0 wt % of a silica slurry; and on an order of 0.01 wt % to 2.0 wt % of ethylendiamine; and the third CMP process uses a slurry comprising:

KOH; and deionized $H_2O$.

32. The method of claim 30 wherein the the first CMP pad has a first hardness, the second CMP pad has a second hardness, and the third CMP pad has a third hardness, the first hardness being greater than the second hardness and the third hardness being greater than the second hardness.

\* \* \* \* \*